United States Patent
Kafka et al.

(10) Patent No.: US 6,417,955 B1
(45) Date of Patent: Jul. 9, 2002

(54) STACK PUMPED VANADATE AMPLIFIER

(75) Inventors: James D. Kafka, Mountain View; James B. Clark, Campbell; Jason D. Henrie, Los Altos, all of CA (US)

(73) Assignee: Spectra Physics Lasers, Inc., Mountian View, CA (US)

( * ) Notice: Subject to any disclaimer, the term of this patent is extended or adjusted under 35 U.S.C. 154(b) by 0 days.

(21) Appl. No.: 09/461,517

(22) Filed: Dec. 14, 1999

(51) Int. Cl.[7] .............................................. H01S 3/098
(52) U.S. Cl. ...................................................... 359/333
(58) Field of Search ................................ 359/333, 340, 359/342; 372/10, 18, 19, 66

(56) References Cited

U.S. PATENT DOCUMENTS

| | | | |
|---|---|---|---|
| 4,835,778 A | * 5/1989 | Kafka et al. | 372/6 |
| 4,847,850 A | * 7/1989 | Kafka et al. | 372/71 |
| 4,872,177 A | * 10/1989 | Baer et al. | 372/75 |
| 5,323,414 A | 6/1994 | Baird et al. | 372/75 |
| 5,663,979 A | * 9/1997 | Marshall | 372/103 |
| 5,940,419 A | * 8/1999 | Xie | 372/22 |
| 6,016,323 A | * 1/2000 | Kafka et al. | 372/20 |
| 6,141,143 A | * 10/2000 | Marshall | 359/342 |
| 6,185,235 B1 | * 2/2001 | Cheng et al. | 372/39 |
| 6,347,101 B1 | * 2/2002 | Wu et al. | 372/10 |

OTHER PUBLICATIONS

Krainer et al., "Passively mode–locked Nd:YVO/sub 4/laser with up to 13 GHz repetition rate", CLEO '99, pp. 58–59, May 23–28, 1999.*

Gray et al., "Pumping Nd: YAG lasers: lamp or diode array?", Lasers & Optronics, v9, n11, p. 40, Nov. 1990.*

Feugnet, Bussac, Larat, Schwarz, Pocholle, "High–efficiency $TEM_{00}$ $Nd:YVO_4$ laser longitudinally pumped by a high–power array" Optics Letters, Jan. 15, 1995, vol. 20, No. 2.

Kafka, Watts, Pieterse, "Synchronously pumped optical parametric oscillators with $LiB_3O_5$" Opt. Soc. Am. B, Nov. 1995, vol. 12, No. 11.

Bibeau, Beach, Ebbers, Emanuel, Skidmore, "CW and Q–switched performance of a diode end–pumped Yb:YAG laser" Advanced Solid State Lasers, 1997, OSA TOPS vol. 10.

Nebel, Ruffing, Wallenstein, "A high power diode–pumped all–solid–state RGB laser source" Postdeadline paper, CLEO 1998.

* cited by examiner

Primary Examiner—Thomas H. Tarcza
Assistant Examiner—Deandra M Hughes
(74) Attorney, Agent, or Firm—Paul Davis; Heller Ehrman White & McAuliffe

(57) ABSTRACT

An amplifier uses a two-dimensional array of cw diodes to produce a pump beam. A coupler is positioned to receive the pump beam. The coupler reduces a cross-sectional dimension of the pump beam and creates a modified pump beam. A vanadate gain medium is positioned adjacent to the coupler. The vanadate gain medium absorbs at least a portion of the modified pump beam and is positioned to receive an input beam from an input beam source and produce an amplified output beam.

34 Claims, 2 Drawing Sheets

STACK PUMPED VANADATE AMPLIFIER

BACKGROUND

1. Field of the Invention

This invention relates generally to laser amplifiers and more particularly to high average power cw laser amplifiers.

2. Description of Related Art

Laser amplifiers have been built using neodymium doped vanadate crystals as the gain media. An end-pumped amplifier has been demonstrated using a fiber coupled diode bar as the pump source. A mode-locked oscillator that produces 1.8 W of average power has been amplified to an average power of 6 W pumped by two cw fiber-coupled diode bars, each producing 13 W of pump power. The gain medium was an 8 mm vanadate crystal with a doping of 0.5%. For this application, vanadate was found to be superior to Nd:YAG or Nd:YLF in part because of vanadate's higher emission cross section. This was described in J. D. Kafka, et al., J. Opt. Soc. Am. B., 12, page 2147 (1995). Kafka and Pieterse disclose one configuration of this amplifier in U.S. Pat. No. 5,812,308.

Systems have been built with multiple stages of vanadate amplifiers. An example of such a system amplified a mode locked vanadate oscillator that produced 4.2 W of average power. The output of the oscillator was amplified to 42 W in one double-pass and three single-pass vanadate amplifiers. Each of the amplifiers was pumped by two cw fiber-coupled diode bars, which generated a total of 25 W of diode power for each stage. This system was described in A. Nebel, et al., CLEO 1998, OSA Technical Digest, postdeadline paper CPD3. The high gain observed in these systems was due to a combination of the high emission cross-section of vanadate and use of an end-pumping geometry.

Diode bars have traditionally been limited to about 40 W per bar at 808 nm. To achieve higher pump powers, stacks of diode bars have been made as two-dimensional arrays. One example is part number MMO-808-240-03, commercially available from Opto-Power Corporation, Tucson, Ariz., a stack of six diode bars, each producing 35 W of pump power for a total of 200 W. The output area of the stack is typically 1 cm by 1 cm. The pump power needs to be concentrated in a smaller spot in order to obtain high gain from an end pumped vanadate amplifier.

Stacks of diode bars have been used to pump high power oscillators as described in C. Bibeau, et al., OSA TOPS Vol. 10 Advanced Solid State Lasers, 1997, page 276. In this paper, Yb:YAG was selected as the gain medium because it has a low quantum defect. The low quantum defect resulted in less heat generation during lasing than comparable Nd-based laser systems. For systems that use high average power cw stacks, care must be taken to avoid thermal effects. Thus Yb:YAG has been the material of choice.

Pulsed diode lasers have also been used in a stack pumped oscillator. In this case, although the peak power is high, the average power is much lower and thermal problems are much less important. The combination of vanadate and a pulsed diode stack has been demonstrated. Vanadate was selected because of its higher absorption coefficient which maintains a gain deposition in a small volume. The pulsed diode lasers were limited to only 2 W of average power and the vanadate crystal was intentionally highly doped at 1% to maintain the gain deposition in a small volume. This system is described in G. Feugnet, et al., SPIE Proceeding Vol. 2698, page 105, 1996. This teaches a system that is not applicable for high average power systems. A reduced gain volume is not desirable in a high power cw pumped system since it would lead to strong thermal effects. There is a need for a high gain, cw amplifier system to achieve output powers greater than 40 W. There is a further need for an amplifier system that provides for extraction of at least 20 W from a single stage.

SUMMARY

Accordingly, it is an object of the present invention to provide a high gain, cw amplifier system to achieve output powers greater than 40 W.

Another object of the present invention is to provide an amplifier system that provides for extraction of at least 20 W from a single stage.

Yet another object of the present invention is to provide a method of amplifying an input beam and produce output powers of at least 40 W.

These and other objects of the present invention are achieved in an amplifier with a two-dimensional array of cw diodes that produce a pump beam. A coupler is positioned to receive the pump beam. The coupler reduces a cross-sectional dimension of the pump beam and creates a modified pump beam. A vanadate gain medium is positioned adjacent to the coupler. The vanadate gain medium absorbs at least a portion of the modified pump beam and is positioned to receive an input beam from an input beam source.

In another embodiment of the present invention, a method of amplifying an input beam includes providing an amplifier that has a two-dimensional array of cw diodes that produces a pump beam. A coupler is positioned to receive the pump beam and create a modified pump beam. The amplifier has a vanadate gain medium. An input beam source is provided which produces the input beam. The modified pump beam pumps the vanadate gain medium. The input beam is directed to the vanadate gain medium, which then produces an amplified input beam.

DETAILED DESCRIPTION OF THE PREFERRED EMBODIMENTS

Figure 1:
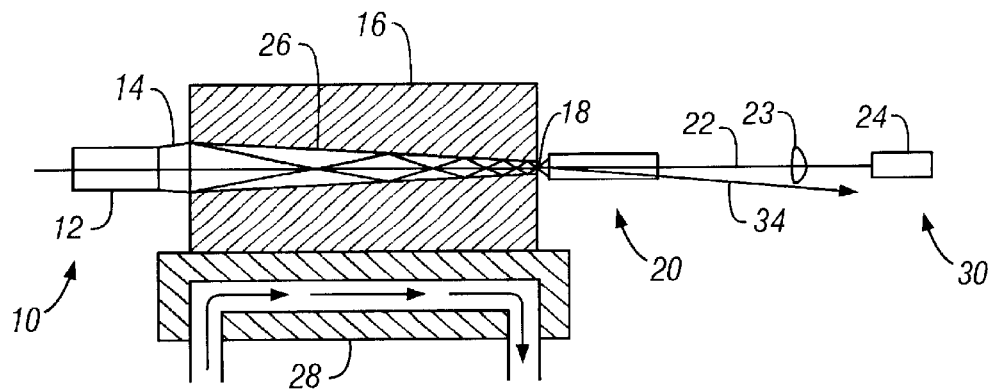
FIG. 1 is a schematic diagram of one embodiment of an amplifier of the present invention.

One embodiment of an amplifier of the present invention is illustrated in FIG. 1. Amplifier 10 includes a two-dimensional array of cw diodes 12 that produces a pump beam 14. A coupler 16 is positioned to receive pump beam 14. Coupler 16 is selected to reduce a cross-sectional dimension of pump beam 14 and then produce a modified pump beam 18. A vanadate gain medium 20 is positioned adjacent to coupler 16. Vanadate gain medium 20 absorbs at least a portion of modified pump beam 18. An input beam 22 is produced by an input beam source 24. Input beam 22 is incident on vanadate gain medium 20. Input beam 22 may be mode-matched by an imaging element including a lens, lens system or telescope 23, so that the mode size of the input beam substantially overlaps the region in the vanadate gain medium 20 where the modified pump beam 18 is absorbed. The size of input beam 22 may be optimized for highest gain or best beam quality depending on the application.

The vanadate gain medium preferably has a doping level of 0.5% or less and more preferably 0.3% or less in order to avoid thermal effects in the amplifier. This low doped vanadate crystal preferably has a length of 8 mm or longer and more preferably 12 mm or longer in order to absorb a significant portion of the pump light Suitable input beam sources 24 include but are not limited to, a mode-locked oscillator, a Q-switched oscillator, a single frequency oscillator and an oscillator/amplifier system. An example of a suitable mode locked oscillator is a mode locked vanadate laser such as that described in J. D. Kafka, et al., J. Opt. Soc. Am. B., 12, page 2147 (1995). Suitable oscillator/amplifier systems are also described in this reference. Suitable Q-switched sources include the Q-switched vanadate laser, model T20-V80-106Q, available from the OEM division of Spectra-Physics Lasers, Inc., Mountain View, Calif.

In various embodiments, coupler 16 is a lens duct, a reflective coupler, a hollow reflective coupler, and the like. When coupler 16 is a hollow reflective coupler, pump beam 14 is captured by reflective coupler 16 at an entrance aperture. After undergoing multiple reflections at reflective surfaces while traversing the interior volume of hollow reflective coupler 16, radiation passes through an exit aperture and into vanadate gain medium 20. Hollow reflective coupler 16 can include a tunnel-shaped interior channel 26

As described, passing through hollow reflective coupler 16 alters, or conditions, the fluence, numerical aperture, and spatial intensity distribution of pump beam 14 in a manner designed to properly match the output from the optical pump source to the characteristics of the gain medium. In certain embodiments, this involves minimization of the NA at the exit aperture. This can be achieved by designing hollow reflective coupler 16 that is sufficiently long to provide a smooth intensity profile at the exit aperture, but sufficiently short to prevent an excessive increase in NA of the exit aperture. Additionally, hollow reflective coupler 16 is sufficiently short to ensure high throughput.

Hollow reflective coupler 16 may be fabricated from many types of materials. Typical embodiments can be made from metals, such as copper, aluminum or other materials, preferably with good thermal conductivity. Accordingly, the internal reflective surfaces may be substantially metallic in certain embodiments. Other embodiments include hollow reflective coupler 16 with a coupler body that is substantially glass or another non-metal material used as a reflector.

A portion of hollow reflective coupler 16 may be coated with a coating layer. Typical coating layers are formed from multi-layer dielectric coatings, gold or silver or aluminum or nickel or chrome or other highly reflective materials. A preferred embodiment uses gold.

In certain embodiments, hollow reflective coupler 16 is in thermal communication with a cooler 28. Cooler 28 acts to remove heat generated by the interaction of the pumping radiation with the small but finite absorption of the reflective surfaces of reflective coupler 16. Particular embodiments of the cooler are a conduction cooler or a convection cooler.

Preferably, pump beam 14 has an average power of at least 100 W, more preferably of at least 200 W. The two-dimensional array of cw diodes 12 includes at least two diode bars, and preferably at least six diode bars. Alternatively, the two-dimensional array of cw diodes 12 can be an array of surface emitting lasers.

Figure 2:
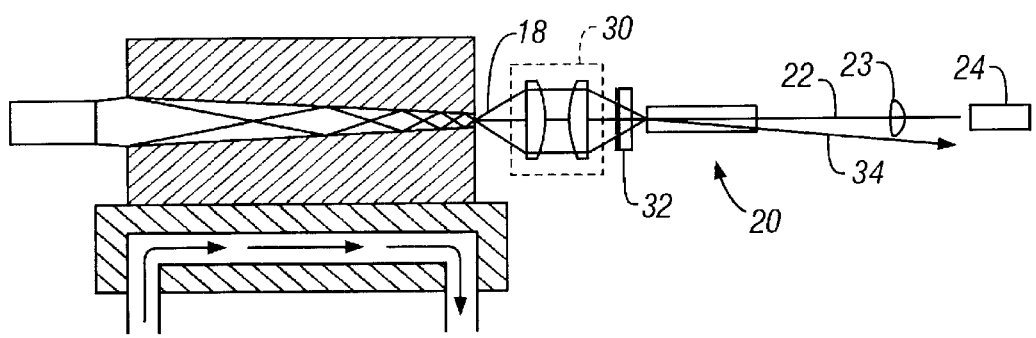
FIG. 2 is a schematic diagram of another embodiment of an amplifier of the present invention.

In one embodiment, shown in FIG. 2, at least one optical element 30 is positioned to mode match the modified pump beam 18 to the vanadate gain medium 20. Optical element 30 can be a lens. A singlet lens or a doublet lens, as shown in the figure, may be used. The lens may be either a spherical or cylindrical lens. A diachronic reflector 32 that transmits the pump light and reflects the input beam can be included and positioned between coupler 16 and vanadate gain medium 20. The amplifier system can be quite compact. In one embodiment, amplifier 10 has a footprint no greater than 150 cm$^2$. In another embodiment, amplifier 10 has a volume no greater than 1000 cm$^3$.

The present invention is also a method of amplifying input beam 22 to produce an amplified output beam 34. In this embodiment, pump beam 18 has an average power of at least 100 W, and more preferably 200 W. Input beam 22 can include mode-locked pulses, Q-switched pulses or be a cw single frequency beam. Amplified output beam 34 can have an average power of at least 25 W, more preferably at least 35 W and more preferably 45 W.

Figure 3:
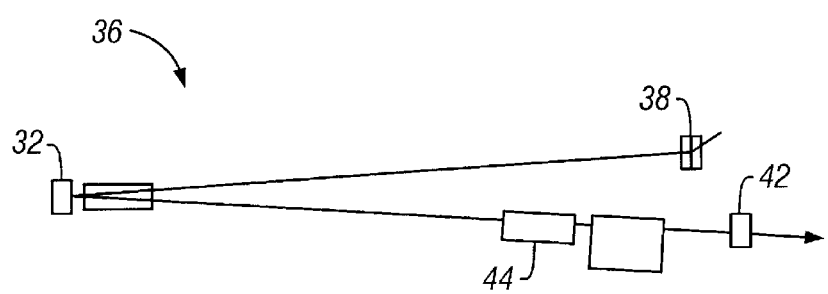
FIG. 3 is a schematic diagram of an oscillator that incorporates the amplifier of FIG. 1.
Figure 4:
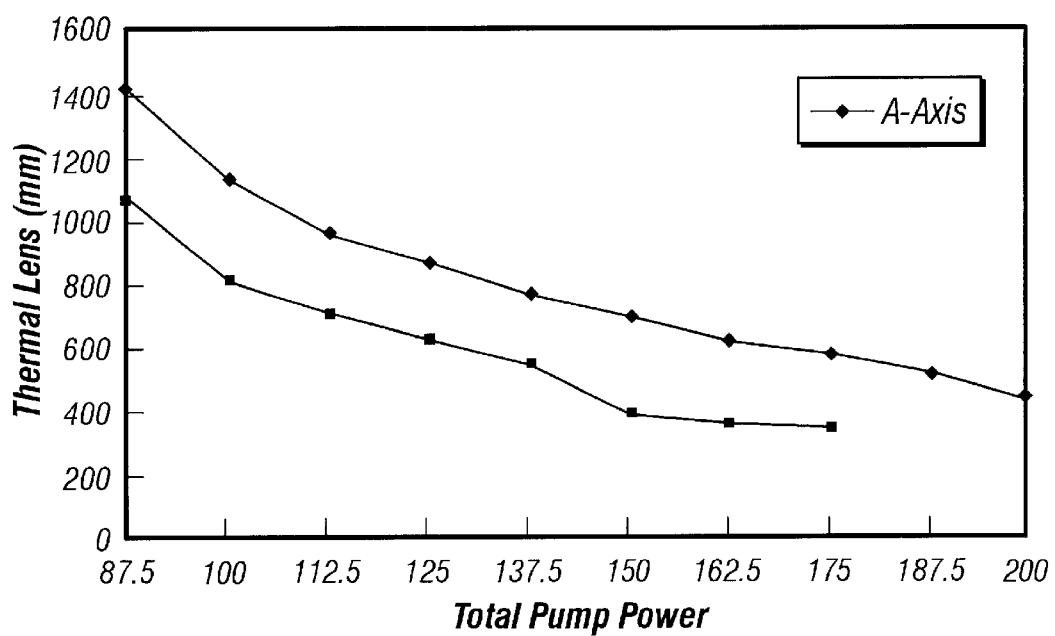
FIG. 4 is a graph illustrating the power of a thermal lens in a stacked pumped vanadate oscillator that is shown in FIG. 3.

Referring now to FIG. 3, a stack pumped vanadate amplifier was evaluated by constructing a laser oscillator 36 that included amplifier 10. The results are shown in Table 1. Laser oscillator 36 included a diachronic reflector mirror 32, a cartridge mount, high reflector flat mirror 38 and a flat mirror output coupler 42. The cavity included a dual axis Q-switch 44 which was not used for this experiment. The vanadate rod was 4 mm in diameter and 12 mm long. It had a neodymium doping level of 0.15% and was mounted in the cartridge mount. Pump beam 18 was polarized parallel to the a-axis of vanadate gain medium 20. With 200 W of average power emitted from two-dimensional array of diodes 12, 172.9 W was incident on vanadate gain medium 20. The thermal lens had a focal length of 431 mm. An intracavity collimating lens or curved mirror could be used to compensate a thermal lens of this magnitude. These results demonstrate that very high powers were efficiently coupled into the vanadate gain medium 20 without creating strong thermal effects as illustrated in the graph of FIG. 4.

TABLE 1

| Diode Current (amps) | Diode Power (watts) | Power at Crystal (watts) | Output Power (watts) | Thermal Lens (mm) |
| --- | --- | --- | --- | --- |
| 27.6 | 87.5 | 75.6 | 15.5 | 1417 |
| 30.8 | 100 | 86.5 | 21.7 | 1126 |
| 32.7 | 112.5 | 97.3 | 25 | 959 |
| 34.6 | 125 | 108.1 | 28.8 | 864 |
| 36.5 | 137.5 | 118.9 | 35.1 | 766 |
| 38.4 | 150 | 129.7 | 40.2 | 686 |
| 40.3 | 162.5 | 140.5 | 44.5 | 619 |
| 42.2 | 175 | 151.3 | 50.2 | 574 |
| 44.3 | 187.5 | 162.1 | 53.8 | 516 |
| 46.3 | 200 | 172.9 | 56.5 | 431 |

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An amplifier, comprising:

a two-dimensional array of cw diodes that produces a pump beam;

a reflective coupler positioned to receive the pump beam and reduce a cross-sectional dimension of the pump beam to produce a modified pump beam that has an average power of at least 200 W; and a vanadate gain medium positioned adjacent to the reflective coupler to absorb at least a portion of the modified pump beam and positioned to receive an input beam from an input beam source.

2. The amplifier of claim 1, wherein the input beam source is an oscillator.

3. The amplifier of claim 2, wherein the oscillator is a mode-locked oscillator.

4. The amplifier of claim 2, wherein the oscillator is a Q-switched oscillator.

5. The amplifier of claim 2, wherein the oscillator is a single frequency oscillator.

6. The amplifier of claim 1, wherein the input beam source is an oscillator/amplifier system.

7. The amplifier of claim 1, wherein the vanadate gain medium has a doping level of 0.5% or less.

8. The amplifier of claim 1, wherein the vanadate gain medium has a doping level of 0.3% or less.

9. The amplifier of claim 1, wherein the reflective coupler is a hollow reflective coupler.

10. The amplifier of claim 9, wherein the hollow reflective coupler has a tunnel shaped geometry.

11. The amplifier of claim 1, wherein the pump beam has an average power of at least 100 W.

12. The amplifier of claim 1, wherein the two-dimensional array of cw diodes includes at least two diode bars.

13. The amplifier of claim 1, wherein the two-dimensional array of cw diodes includes at least six diode bars.

14. The amplifier of claim 1, wherein the two-dimensional array of cw diodes includes an array of surface emitting lasers.

15. The amplifier of claim 1, further comprising:
at least one optical element positioned to mode match the pump beam to the vanadate gain medium.

16. The amplifier of claim 15, wherein the at least one optical element is a lens.

17. The amplifier of claim 1, farther comprising: a diachronic reflector positioned between the reflective coupler and the vanadate gain medium.

18. The amplifier of claim 1, wherein the amplifier has a footprint no greater than 150 cm$^2$.

19. The amplifier of claim 1, wherein the amplifier has a volume no greater than 1000 cm$^3$.

20. A method of amplifying an input beam, comprising:
providing an amplifier that includes at least a two-dimensional array of cw diodes that produce a pump beam, a reflective coupler positioned to receive the pump beam and produce a modified pump beam that has an average power of at least 200 W, and a vanadate gain medium;

providing an input beam source that produces an input beam;

pumping the vanadate gain medium with the modified pump beam directing the input beam to be incident on the vanadate gain medium; and producing an amplified output beam.

21. The method of claim 20, wherein the pump beam has an average power of at least 100 W.

22. The method of claim 20, wherein the input beam includes mode-locked pulses.

23. The method of claim 20, wherein the input beam includes Q-switched pulses.

24. The method of claim 20, wherein the input beam is single frequency.

25. The method of claim 20, wherein the amplified output beam has an average power of at least 25 W.

26. The method of claim 20, wherein the amplified output beam has an average power of at least 35 W.

27. The method of claim 20 wherein the amplified output beam has an average power of at least 45 W.

28. The amplifier of claim 20, wherein the input beam source is an oscillator.

29. The amplifier of claim 28, wherein the oscillator is a mode-locked oscillator.

30. The amplifier of claim 28, wherein the oscillator is a Q-switched oscillator.

31. The amplifier of claim 28, wherein the oscillator is a single frequency oscillator.

32. The amplifier of claim 20, wherein the input beam source is an oscillator/amplifier system.

33. The amplifier of claim 20, wherein the vanadate gain medium has a doping level of 0.5% or less.

34. The amplifier of claim 20, wherein the vanadate gain medium has a doping level of 0.3% or less.

* * * * *